US008878283B2

(12) United States Patent
Denison et al.

(10) Patent No.: US 8,878,283 B2
(45) Date of Patent: Nov. 4, 2014

(54) QUASI-VERTICAL GATED NPN-PNP ESD PROTECTION DEVICE

(75) Inventors: Marie Denison, Plano, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/171,040

(22) Filed: Jun. 28, 2011

(65) Prior Publication Data
US 2012/0074458 A1 Mar. 29, 2012

Related U.S. Application Data

(62) Division of application No. 11/967,732, filed on Dec. 31, 2007, now Pat. No. 7,968,936.

(51) Int. Cl.
| H01L 29/66 | (2006.01) |
| H01L 27/02 | (2006.01) |
| H01L 29/74 | (2006.01) |
| H01L 29/87 | (2006.01) |
| H01L 29/06 | (2006.01) |

(52) U.S. Cl.
CPC ......... *H01L 27/0262* (2013.01); *H01L 29/0696* (2013.01); *H01L 29/7436* (2013.01); *H01L 29/66393* (2013.01); *H01L 29/87* (2013.01); *H01L 29/66121* (2013.01)
USPC ............. 257/328; 257/E21.686; 257/E21.693

(58) Field of Classification Search
CPC .......................... H01L 29/7813; H01L 29/1095
USPC ............................ 257/328, E21.676, E21.693
See application file for complete search history.

(56) References Cited

U.S. PATENT DOCUMENTS

| 5,504,362 A | 4/1996 | Pelella et al. |
| 6,365,932 B1 * | 4/2002 | Kouno et al. ................. 257/341 |
| 6,924,531 B2 * | 8/2005 | Chen et al. .................... 257/336 |
| 2004/0108567 A1 * | 6/2004 | Denison et al. ............... 257/500 |
| 2008/0157197 A1 * | 7/2008 | Hsieh et al. ................... 257/339 |

OTHER PUBLICATIONS

D. Pogany, S. Bychikhin, E. Gornik, M. Denison, N. Jensen, G. Groos and M. Stecher, "Moving Current Filaments in ESD Protection Devices and Their Relation to Electrical Characteristics" Proceedings of the IRPS 2003, Dallas, Texas, 8 pgs.
Sameer Pendharkar, Ross Teggatz, Joe Devore, John Carpenter, Taylor Efland and Chin-Yu Tsai, "SCR-LDMOS—A Novel LDMOS Device with ESD Robustness", Proceedings of the ISPSD 2000, Toulouse, France, 4 pgs.
P. Moens, S. Bychikhin, K. Reynders, D. Pogany and M. Zubeidat, "Effects of Hot Spot Hopping and Drain Ballasting in Integrated Vertical DMOS Devices Under TLP Stress", Proceedings of the IRPD 2004, IRPS 2004, Phoenix, USA, pp. 393-398.

(Continued)

*Primary Examiner* — Dale E Page
(74) *Attorney, Agent, or Firm* — Alan A. R. Cooper; Frederick J. Telecky, Jr.

(57) ABSTRACT

Fashioning a quasi-vertical gated NPN-PNP (QVGNP) electrostatic discharge (ESD) protection device is disclosed. The QVGNP ESD protection device has a well having one conductivity type formed adjacent to a deep well having another conductivity type. The device has a desired holding voltage and a substantially homogenous current flow, and is thus highly robust. The device can be fashioned in a cost effective manner by being formed during a BiCMOS or Smart Power fabrication process.

6 Claims, 18 Drawing Sheets

(56) References Cited

OTHER PUBLICATIONS

Marie Denison, Matej Blaho, Dieter Silber, Joachim Joos, Nils Jensen, Matthias Stecher, Viktor Dubec, Dionyz Pogany and Erich Gornik, "Hot Spot Dynamics in Quasi Vertical DMOS under ESD Stress", Proceedings of the ISPSD 2003, Cambridge, UK, 4 pgs.

Marie Denison, Matej Blaho, Pavel Rodin, Viktor Dubec, Dionyz Pogany, Dieter Silber, Erich Gornik and Matthias Stecher, "Moving Current Filaments in Integrated DMOS Transistors Under Short-Duration Current Stress", IEEE Transactions on Electron Devices, vol. 51, No. 10, Oct. 2004, 9 pgs.

"Adjacent," http://dictionary.reference.com/browse/adjacent?s=t, Jan. 14, 2013.

"Contiguous," http://dictionary.reference.com/browse/contiguous, Jan. 14, 2013.

* cited by examiner

QUASI-VERTICAL GATED NPN-PNP ESD PROTECTION DEVICE

This application is a division of prior application Ser. No. 11/967,732 (now U.S. Pat. No. 7,968,936), filed Dec. 31, 2007, hereby incorporated by reference.

BACKGROUND

The disclosure herein relates generally to designing and fabricating a semiconductor quasi-vertical gated NPN-PNP electrostatic discharge (ESD) protection device.

Electrostatic discharge (ESD) is a continuing problem in the design, manufacture and utilization of semiconductor devices. A major source of ESD exposure to ICs is from the human body (described by the "Human Body Model", HBM). In this situation, a packaged IC acquires a charge when it is held by a human who is electrostatically charged (e.g., from walking across carpeting). A charge of about 0.6 $\mu C$ can be induced on a body capacitance of 150 pF, for example, leading to electrostatic potentials of 4 kV or greater and discharging peak currents of several amperes to the IC for about 100 ns, for example. A second source of ESD is from metallic objects (described by the "Machine model", MM), which is characterized by a greater capacitance, lower internal resistance and transients that have significantly higher rise times and current levels than the HBM ESD source. A third source is described by the "charged device model" (CDM), in which the IC itself becomes charged and discharges to ground in rise times less than 500 ps in the opposite direction than the HBM and MM ESD sources. Furthermore, different types of electrical overstresses during circuit operation are defined in standards dedicated to specific applications like automotive systems.

During ESD events, current is typically discharged between one or more pins or pads exposed to the outside of an IC chip. Such ESD current flows from the pad to ground through vulnerable circuitry in the IC, which may not be designed to carry such currents. Many ESD protection techniques have been employed to reduce or mitigate the adverse effects of ESD events in integrated circuit devices. Many conventional ESD protection schemes for ICs employ peripheral circuits to carry the ESD currents from the pin or pad of the device to ground by providing a low impedance path thereto. In this way, the ESD currents flow through the protection circuitry, rather than through the more susceptible circuits in the chip. In some cases it is also possible to make a device of weak intrinsic ESD robustness self-protecting by some device design modifications which do not impact significantly device function under normal operation.

ESD protection devices, circuits or self protecting elements are typically connected to I/O and other pins or pads on the IC, wherein the pads further provide the normal circuit connections for which the IC was designed.
In the last 20 years, the increasing need for advanced Smart Power circuits, integrating power drivers, high density logic control units, high precision analog circuits and various memories in single chip solutions to be used in increasingly harsh environments has made the development of robust and compact ESD protection devices highly desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

A 3-terminal (anode, gate, and cathode) quasi-vertical gated NPN-PNP (QVGNP) electrostatic discharge (ESD) protection device design is disclosed. The QVGNP ESD protection device is a quasi-vertical drain extended MOS (QVDEMOS) device with additional doped regions (wells) formed laterally adjacent to and short circuited to the drain deep well. There can be two (or more) such additional wells touching each other, eventually having different extents. The additional doped regions along the QVDEMOS drain form the device cathode which can be implemented along one or several sides of the anode (QVDEMOS source and gate region), or distributed inside of the anode area.

The device can be used as a self-protecting QVDEMOS device at an I/O which allows sparing the area of an additional ESD component in parallel to a traditional DEMOS component. Alternatively, it can be used as stand alone ESD protection device.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION OF THE INVENTION

Figure 1:
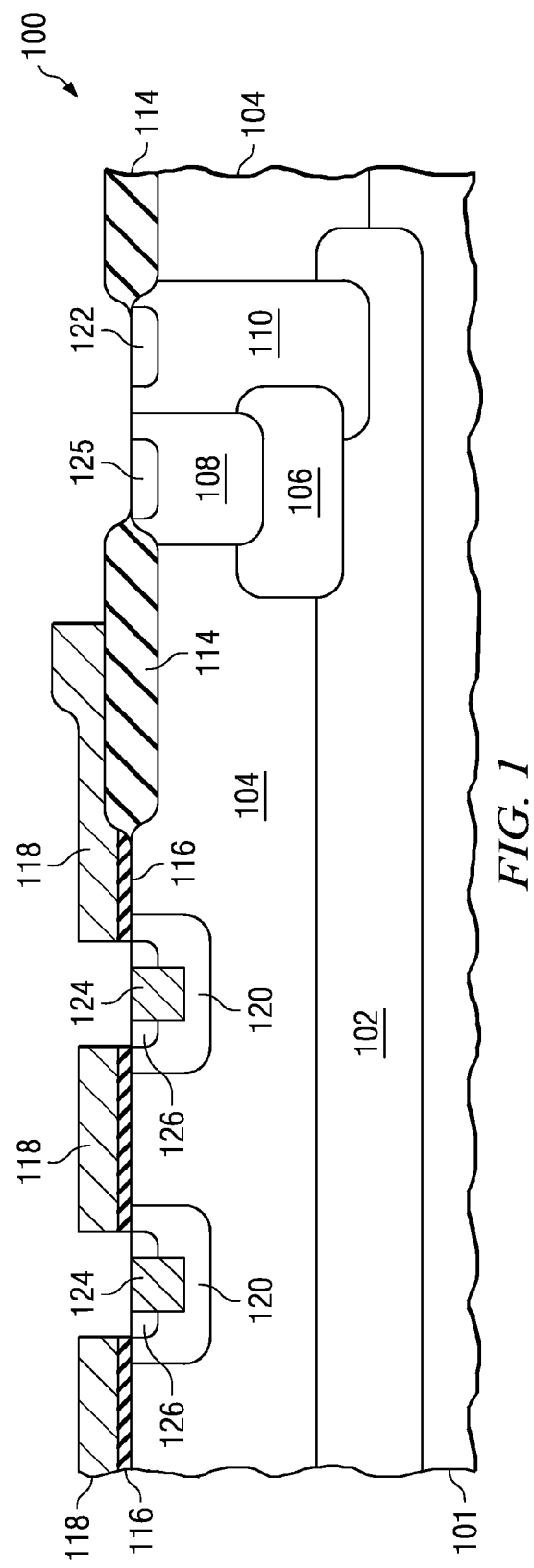
FIG. 1 shows an exemplary embodiment of the present invention, quasi-vertical gated NPN-PNP (QVGNP) ESD protection device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In the examples of this disclosure, it is supposed that semiconductor regions are doped using either dopant implantation or deposition of a doped material at the surface of the semiconductor material followed by diffusion into the semiconductor material. Patterned doped regions are assumed to be obtained by means of traditional lithographic techniques, for example, where lithography broadly refers to processes for transferring one or more patterns between various media.

An exemplary quasi-vertical gated NPN-PNP (QVGNP) electrostatic discharge (ESD) protection transistor 100 is illustrated in FIG. 1. In this embodiment of the present invention the device comprises a first buried layer 102 having a first conductivity type (e.g., n or p type) within a semiconductor body 101 having a second conductivity type (e.g., n or p type). An epitaxial (EPI) layer 104 having the first conductivity type is over the first buried layer 102 and semiconductor body 101. Alternatively the EPI layer 104 can have the second conductivity type and be counter-doped to the first conductivity type by implantation. The dopant concentration of the EPI layer 104 is less than the dopant concentration of the first buried layer 102 as well as the dopant concentration of other subsequently formed regions having the first conductivity type. An optional second buried layer 106 having the second conductivity type is located within at least some of the first buried layer 102 and some of the EPI layer 104. A first well 108 having a second conductivity type is located in the EPI layer 104 above the second buried layer 106. Adjacent to the first well 108 is a deep well 110 with the first conductivity type. One or several (typically up to 20, in this example two) shallow wells 120 of the second conductivity type are spaced apart from the first well 104. The first and the optional second shallow wells 120 comprise a shallow implant 126. Each of the shallow wells 120 and the first well 108 also comprise a contact implant 124 and 125, respectively.

Alternative embodiments of the device of FIG. 1 may comprise one or more additional shallow wells, shallow implants, and contact implants. Optional isolation regions 114 may also be added. The isolation regions usually comprise an oxide layer and may lie above at least part of the first well, the first shallow well, the deep well, and any additional shallow wells that may be added to the device. A patterned gate dielectric 116 is located over the surface of the EPI layer. A gate electrode 118 covers the gate dielectric.

Figure 2:
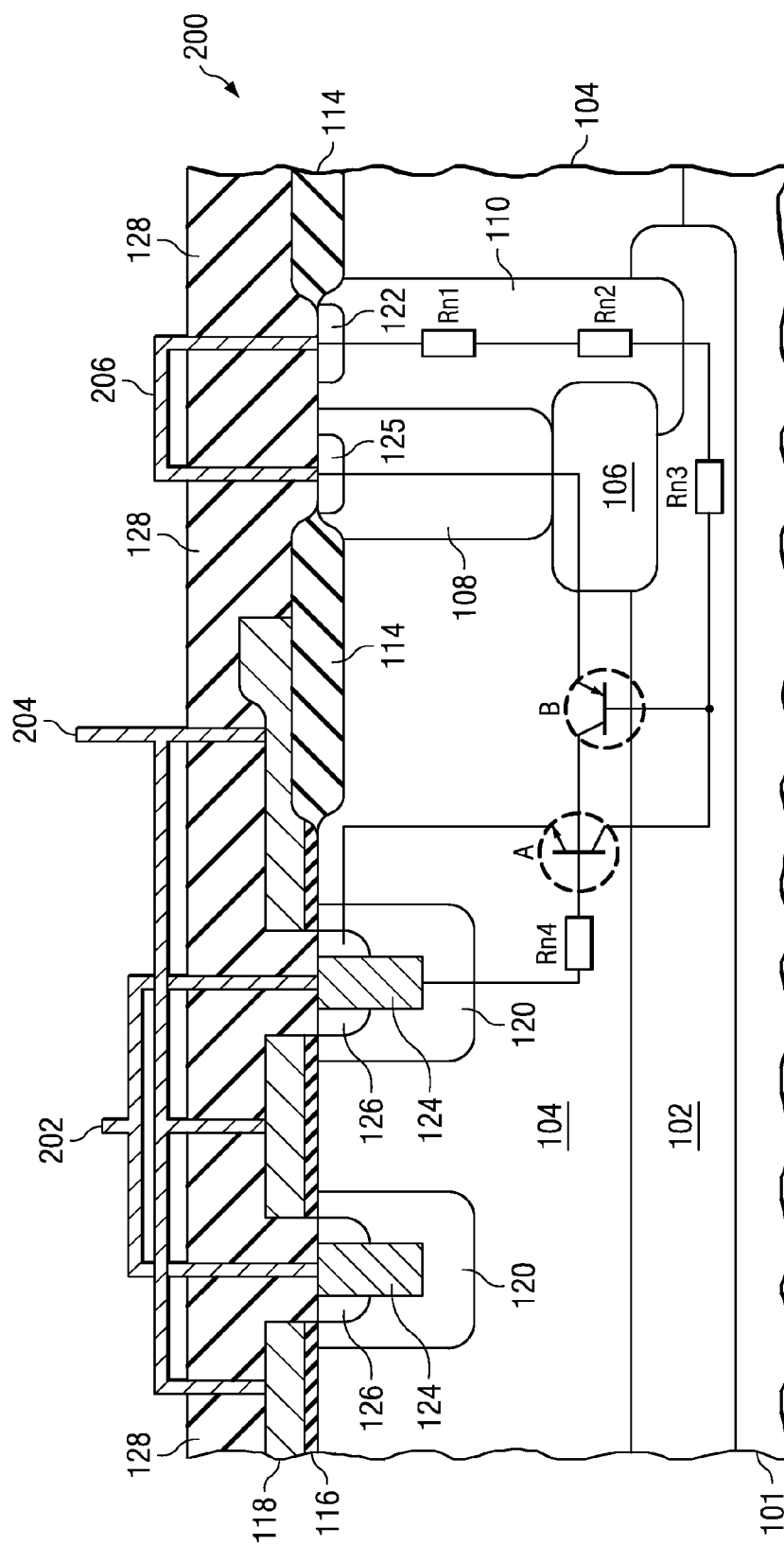
FIG. 2 shows the cross-section of an embodiment of the QVGNP and equivalent circuit schematic.

The proposed device has three terminals as shown in FIG. 2: an anode 202 contacting the QVDEMOS source regions in the wells 120, a gate 204 and a cathode 206 contacting the layers 108, 110, and 122. The device can be used as a standard QVDEMOS under non ESD-relevant conditions, as a self-protecting element, in which case the gate 204 is biased separately from the anode 202. It can also be used as a stand-alone ESD solution, in which case the gate 204 can be short-circuited to the anode 202.

A QVGNP ESD protection device fashioned as described herein has a holding voltage tunable by the layout of the layers 106, 108 added to a VDEMOS device. The device design makes it particularly suitable for Smart Power technology applications. High robustness is obtained by the combined action of the quasi-vertical drain extended MOS parasitic NPN bipolar A (with emitter=source 126, base=backgate=120, collector=104, 102, 110, 122) to the lateral bipolar transistor B of opposite type (with emitter=106, 108, 125, base=102, 104, 110, 122, collector=backgate 120) as shown in FIG. 2.

The coupling between the two bipolar components A and B (FIG. 2) can be tuned by layout. For example, the effective gain of component B is increased when the optional layer 108 is used and is made long, because a larger base-emitter voltage is produced in transistor B by the collector current from bipolar A flowing to the cathode though the buried layer 102 with resistance Rn3 and through the deep well 110 with bottom side resistance Rn2. In absence of layer 106, a similar effect is reached for an increasing depth of layer 108, with the base-emitter voltage of bipolar transistor B produced across layer 110 (top side resistance Rn1). The effective gain of bipolar B is lowered if the spacing between anode and cathode is increased (e.g. 120 on termination side to 108).

The effective gain of the bipolar component A can be significantly varied as well, for example by tuning its base resistance, or by varying the spacing between the contacts to the QVDEMOS backgate 120, 124, in the third dimension of the finger width in the example of a rectangular device. Increasing the VDEMOS channel length decreases the gain of component A which can result in a better balance between A/B components and influence the current homogeneity under ESD surge. Such balance can also be reached by adding some emitter ballast to component A, by decreasing the number of contacts of the QVDEMOS source regions 126 and herewith adding some emitter drift resistance through these regions. The anode finger layout (i.e., shallow well width 120, channel length, frequency of backgate contacts, . . . ) can vary depending on the position relative to the termination or along a given finger.

The coupling of the components A and B and the product of their respective gains directly influences the holding voltage of the device (e.g., npn pnp turns into SCR action or thyristor action with low sustaining voltage around when beta (A)*beta ($\beta$)>1). A high holding voltage is obtained with a weaker coupling of A and B, it is for example suitable for automotive pin applications where the device may not snapback under the battery voltage of the car (e.g., 14.18V) in case of an ESD surge arising during car operation. In some applications though, an ESD component is allowed to have a very low holding voltage, either because of the low supply voltage or because the trigger current of the ESD component is higher than a certain limit which is typically set by latch-up requirements. In such a case, a strong A-B coupling can be realized in the device, resulting in a so-called SCR (silicon controlled rectifier) action. Both SCR and weakly coupled bipolar pair concepts have been demonstrated in the literature to achieve better ESD robustness than simple bipolar devices (e.g., the parasitic NPN of a drain extended MOS transistor).

There are many variations which can be made to the device of FIGS. 1 and 2 to vary their performance. The alternative embodiments of the QVDEMOS ESD protection device of this disclosure are shown in FIGS. 3-10. These embodiments change the levels present and the geometries used in their layouts. While the features of the embodiments are described separately from each other, one skilled in the art would recognize that certain features of one embodiment may be used in conjunction with other features of a separate embodiment.

Figure 3:
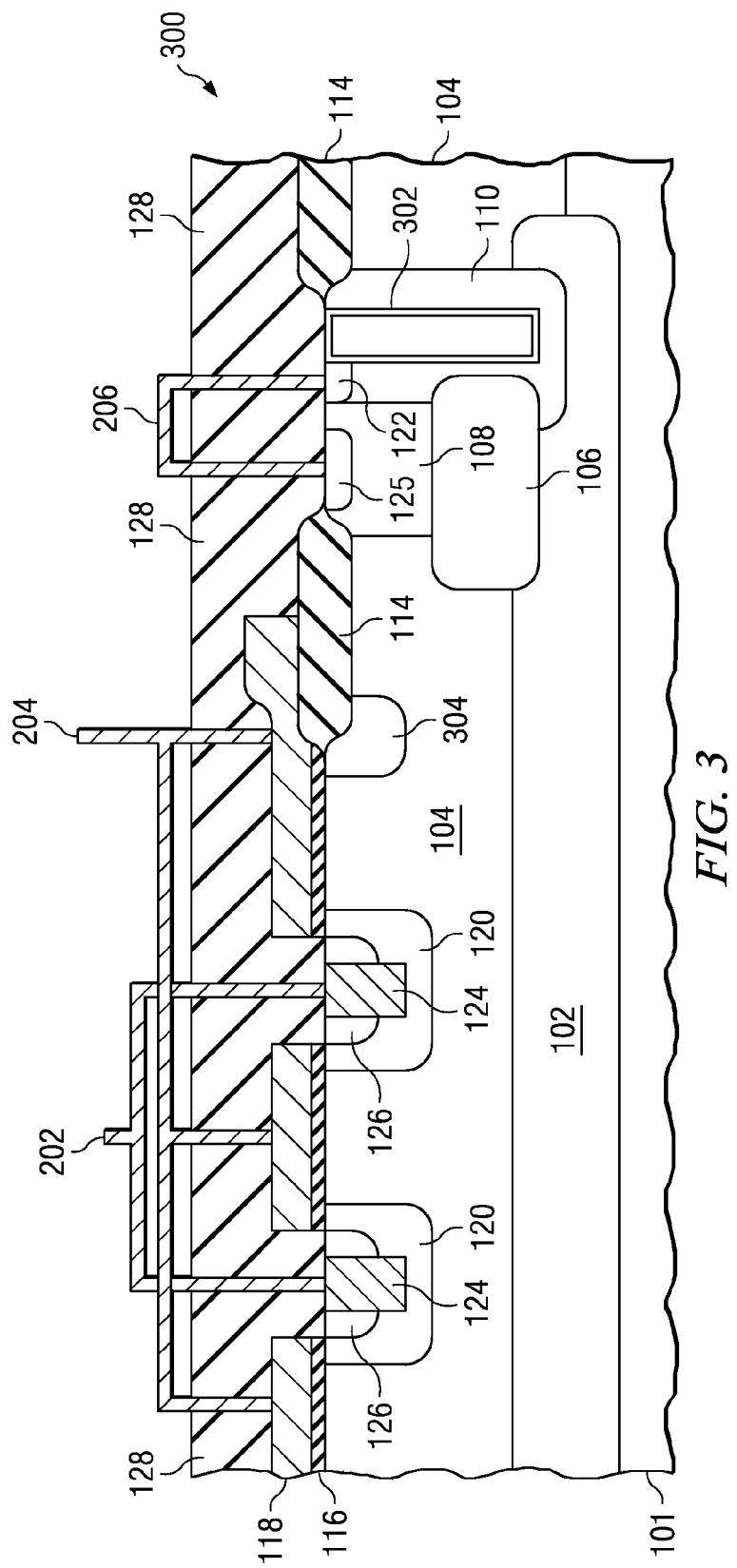
FIG. 3 shows the cross section of another embodiment of a QVGNP with trench conformal drain diffusion.

FIG. 3 shows an alternative embodiment of the present invention. In the Quasi-Vertical Gated NPN-PNP ESD protection device of FIG. 3 a deep trench is added to the device of FIG. 1. The deep well region 110 is conformal to the deep trench 302 and has the first conductivity type. The deep trench 302 is etched into the substrate 101 prior to the deep well implantation or deposition. The edges of the trench comprise a highly doped region of the first conductive type. The addition of the deep trench within the deep well region allows a narrower cathode region to be used in the device, therefore reducing the large surface area that is usual of the deep well region. This reduces the overall chip area of the device.

FIG. 3 further comprises a termination well 304 found underneath the isolation region and either connected to the anode or floating between anode and cathode. The termination well has the second conductivity type and can be engineered for lateral anode/cathode breakdown voltage or for the lateral PNP gain as previously described.

Figure 4:
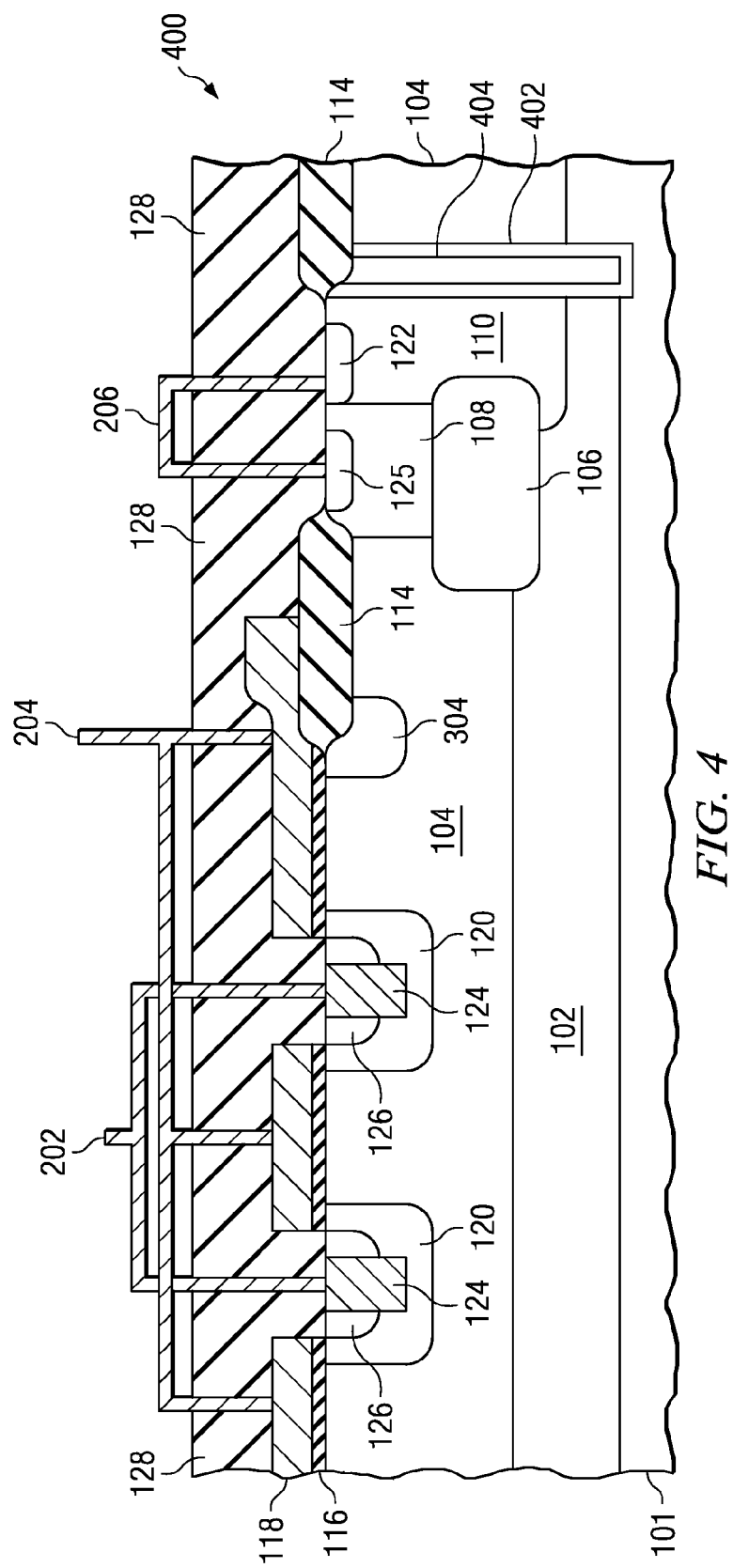
FIG. 4 shows the cross section of another embodiment of a QVGNP with deep drain diffusion abutting to deep isolation trench.

Another embodiment of the present invention is shown in FIG. 4. In this embodiment a deep isolation trench 402 is added abutting the deep well region 110 of the first electrical type. The deep trench 402 is etched into the substrate 101 using, for example, a reactive ion based etch to provide a steep sidewall angle. The deep trench 402 of this embodiment is etched to a depth below that of the first buried layer 102. The trench is filled with oxide 404 and eventually polysilicon for mechanical integrity. The addition of this trench reduces the isolation spacing to adjacent devices. Adjacent devices can be placed directly abutting the deep isolation trench, therefore not requiring the usual isolation spacing necessary in junction isolated technologies.

Figure 5:
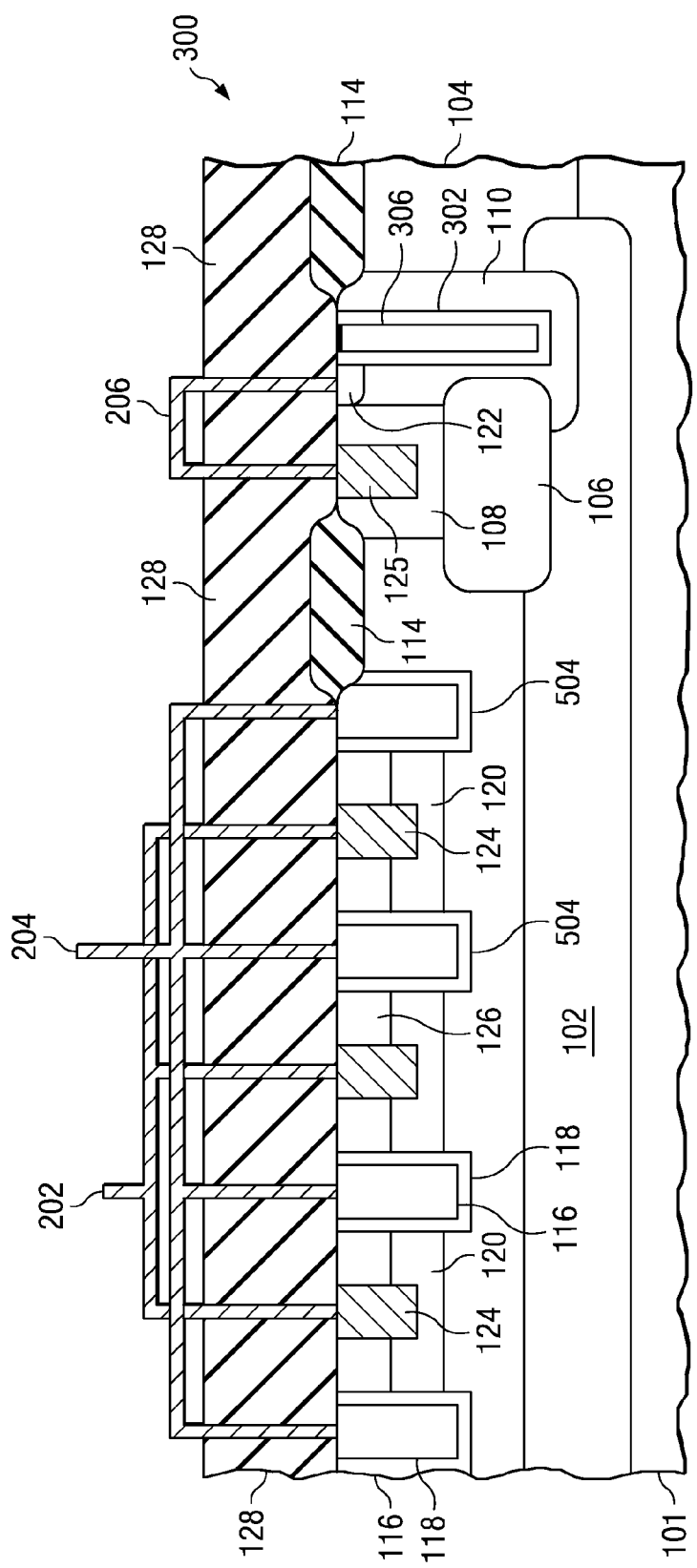
FIG. 5 shows the cross section of another embodiment of a QVGNP with vertical channel (trench gate) and deep trench conformal drain diffusion.

FIG. 5 shows an additional embodiment of the present invention. In this embodiment a blanket shallow well(backgate) 120 is formed over trench gate fingers isolated from the silicon by a thin isolation oxide to form a vertical channel of first conductivity type. The trenches 504 are etched into the substrate 101 of the device. A cathode gate and isolation dielectric are formed in the trenches 504 followed by polysilicon deposition and etch-back. The deep well 110 also comprises a conformal dielectric layer 304 and trench filling 506. This layout, when using high-density trench patterning, has a significant advantage in terms of DEMOS on-resistance and maximum current capability, which significantly reduces the area of silicon used by the device both for usage as a self-protecting MOSFET switch and for usage as an ESD protection device. For high-voltage breakdown, the bottom of the trench can include a thicker isolation oxide according to the state of the art of vertical and quasi-vertical MOSFET transistors.

FIGS. 6-10, show additional embodiment of the present invention. These figures show a top view of a Quasi-Vertical Gated NPN-PNP ESD protection device emphasizing the layout of the device. The layout of the embodiments can have a significant impact on device performance. For example, if the device has a cathode ring around the anode region, the base resistance and thus the effective gain of bipolar transistor B will be much lower than in a case where the device has a circular geometry with the cathode (comprising layers 110, 122, 108) in the center.

Figure 6:
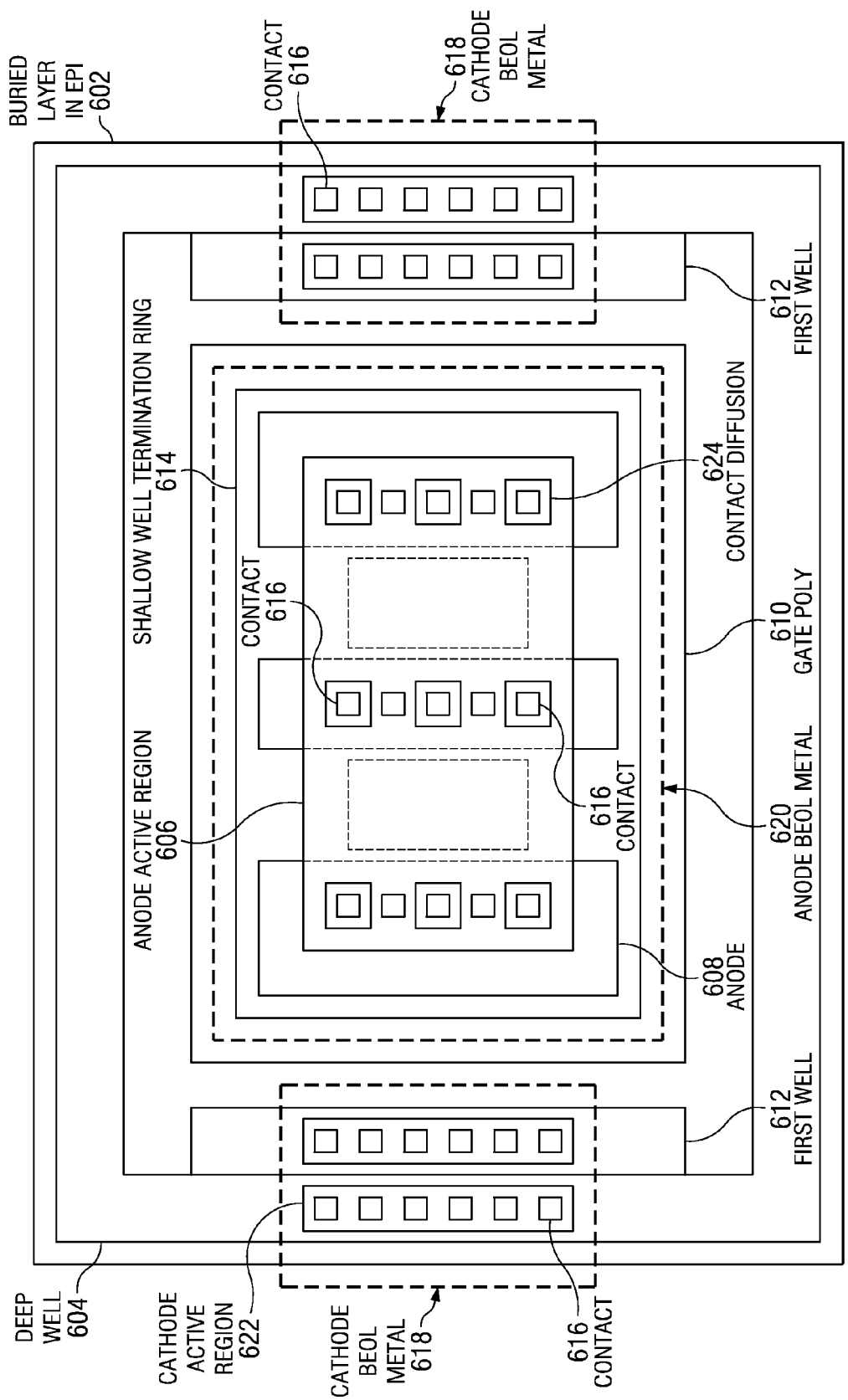
FIG. 6 shows the layout top view of an embodiment of a QVGNP with source fingers, side cathode stripes and backgate contact area segmented along the finger width.

FIG. 6 shows a striped layout of a VDEMOS device, wherein the deep well 604 is implanted in a "ring" pattern. The "ring" pattern is an unbroken rectangle extending along the periphery of the device and enclosing all features in the isolated epitaxy island of the device except the buried layer 602. The first well 612 is implanted in rectangular strips abutting opposite inside edges of the deep well 604. In alternative embodiments the first well 612 may be implanted in separate and arbitrarily shaped regions located along the internal edge of the deep well. The anodes 608, located in the middle of the figure, are formed in such a manner that they geometrically form finger like shapes which are long and narrow. The number of anode fingers and size of fingers may vary based upon the device desired by the designer. For example, the anode fingers may vary from lengths on the order of a few 100 um up to a few millimeters. Contacts 616, over alternating shallow contact implant areas of first and second conductivity in the anode, connect the device to the back end of the line (BEOL) metallization levels 618. With discrete psd contacts along the width, the finger's spacing can be significantly varied, changing the base resistance and therefore the effective gain of the bipolar component A. This spacing can differ in each finger.

Figure 7:
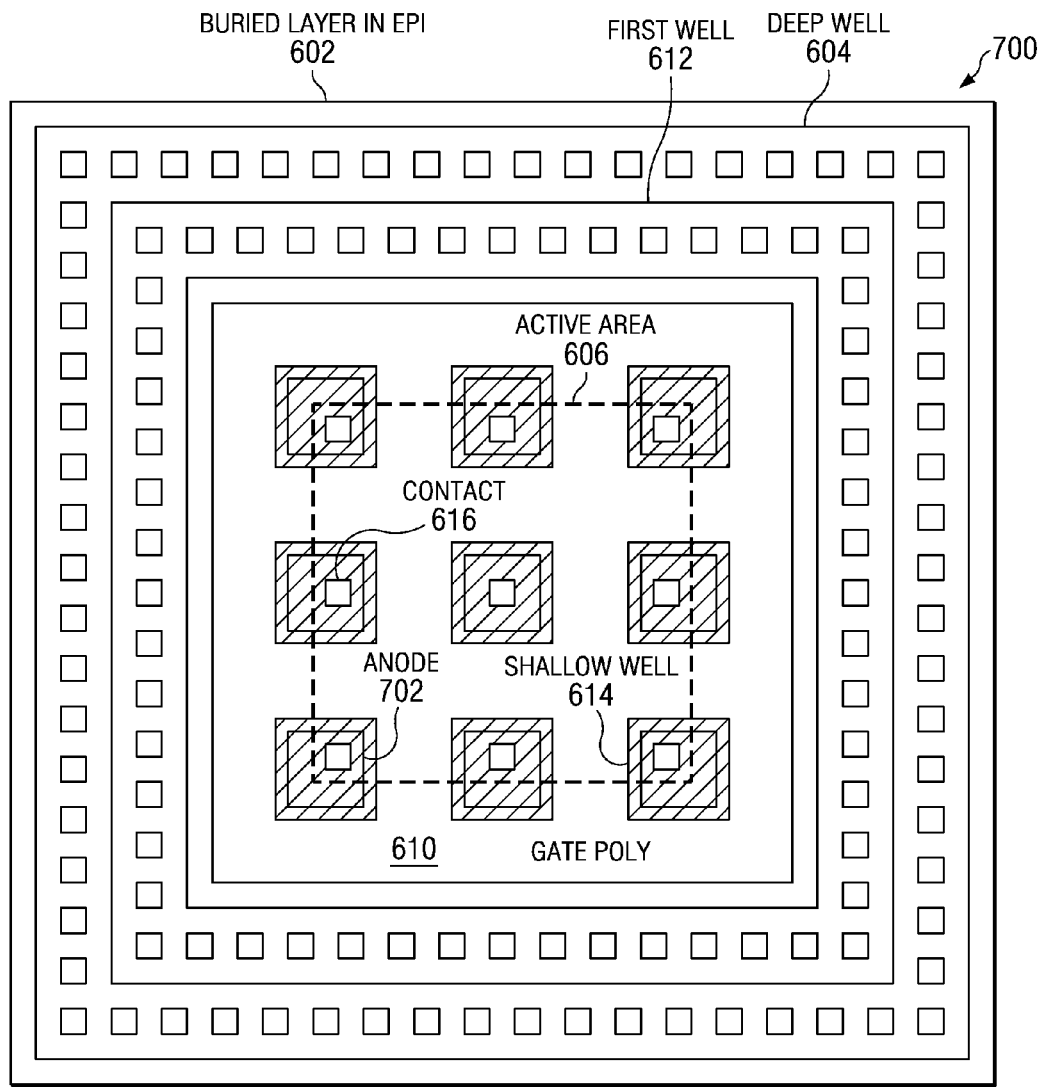
FIG. 7 shows the layout top view of an embodiment of the QVGNP with square source cells and cathode ring at the device periphery.

Another embodiment of the present invention is shown in FIG. 7. This layout is a cell layout. As in FIG. 6, the deep well 604 is implanted in a "ring" pattern, wherein the "ring" pattern is an unbroken rectangle extending along the periphery of the device and enclosing all features of the device except the buried layer 602. In this embodiment the first well 612 is also implanted in a "ring" pattern, abutting all inside edges of the deep well 604. There are nine square source cells shown. The number of cells in the device may be varied. The anode 702 is made of all source cells. They are connected to the BEOL metallization through the use of contacts 616.

Depending on the design rules for the minimum opening of the anode and minimum size of the gate, designers may choose to use varying shape source cells to achieve desired device performance. FIGS. 6 and 7 display only two possible geometries of source cells, but the inventor has contemplated the use of many varying shapes of source cells in conjunction with the present invention (e.g., hexagonal).

Figure 8:
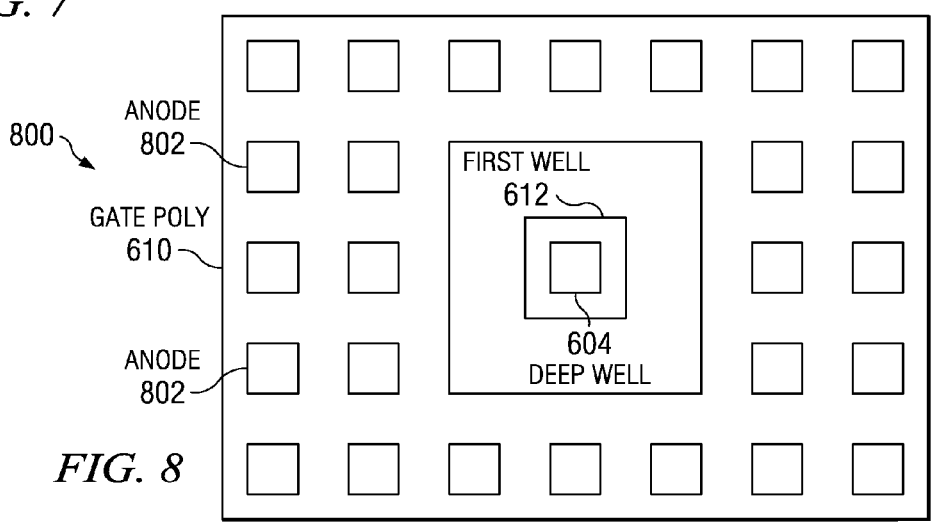
FIG. 8 shows the layout top view of an embodiment of the QVGNP with square source cells and cathode cells distributed across the device area.

FIG. 8 shows an additional embodiment of the present invention. In this embodiment anodes unrestrictedly populate the area of the device. The deep well 604 and the first well 612 are implanted into the substrate in a location such that they are surrounded by gate electrode material 610 and anodes 602. This embodiment is intended to show that cathodes may be freely distributed over the area of the device and are not restricted to the periphery layouts of FIGS. 6 and 7.

Figure 9:
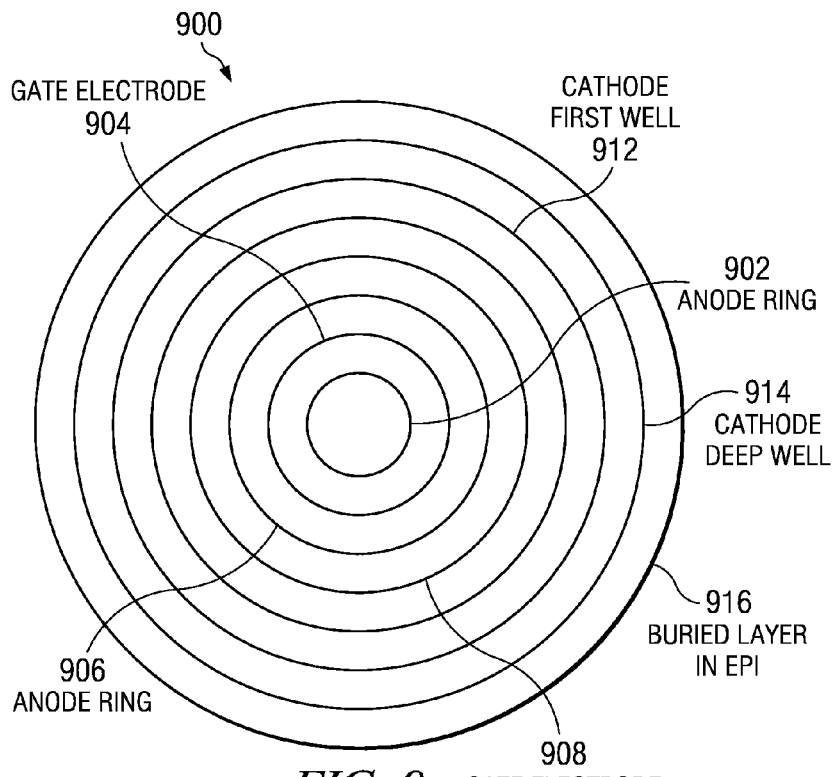
FIG. 9 shows another layout top view of an embodiment of the QVGNP with circular geometry and cathode at the periphery.
Figure 10:
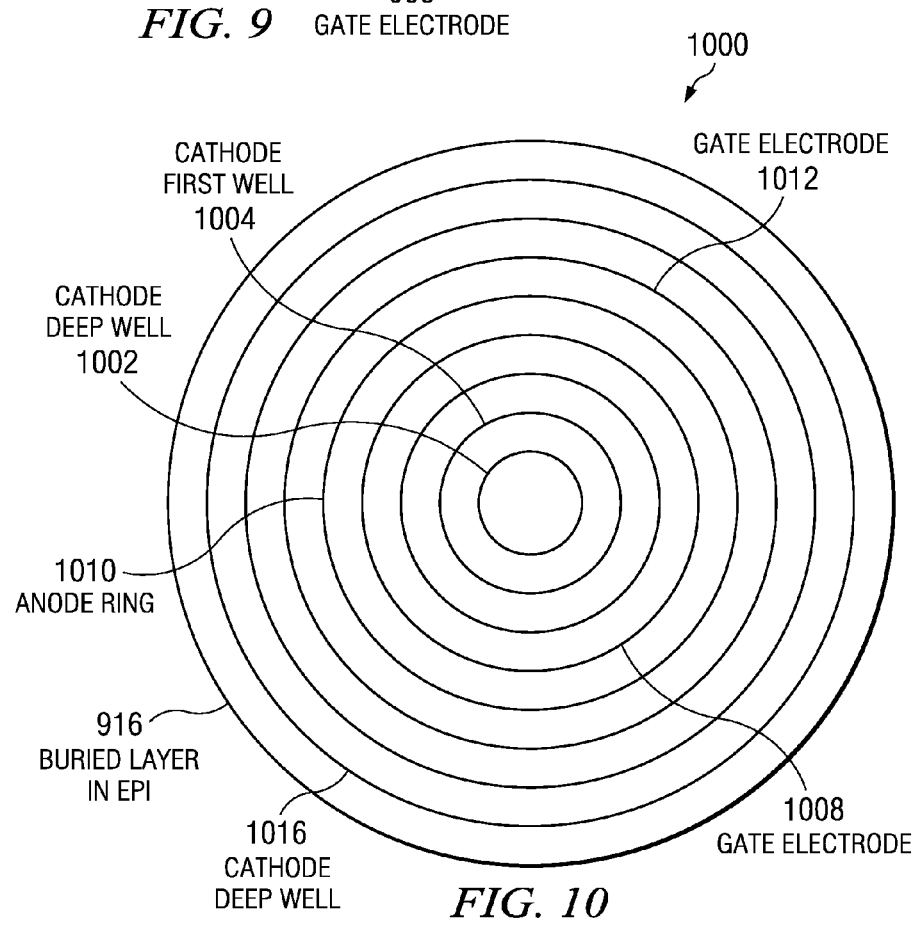
FIG. 10 shows another layout top view of an embodiment of the QVGNP with circular geometry and anode enclosing a cathode, with an additional drain well connected to the cathode at the periphery.

FIGS. 9 and 10 show additional embodiments of the present invention wherein the anode, cathode, and gate regions of the Quasi-Vertical Gated NPN-PNP are arranged in concentric circular geometries. In FIG. 9 the cathode is at the periphery of the device. The anode of the device is formed by concentric rings made of the same implants as in FIG. 1, and separated by gate electrode rings over dielectric. In the example of FIG. 9, there are two separate anode regions 702 and 706. A deep well region 914 is implanted in a circular pattern abutting the first well region 912.

In FIG. 10 a second deep well has been implanted at the periphery of the device to reduce the on-state resistance of the QVDEMOS and the anode surrounds the cathode located in the center of the device. The circular geometry of FIGS. 9 and 10 is an exemplary geometry, other geometries like polygonal (e.g. hexagonal) are possible.

Figure 11A:
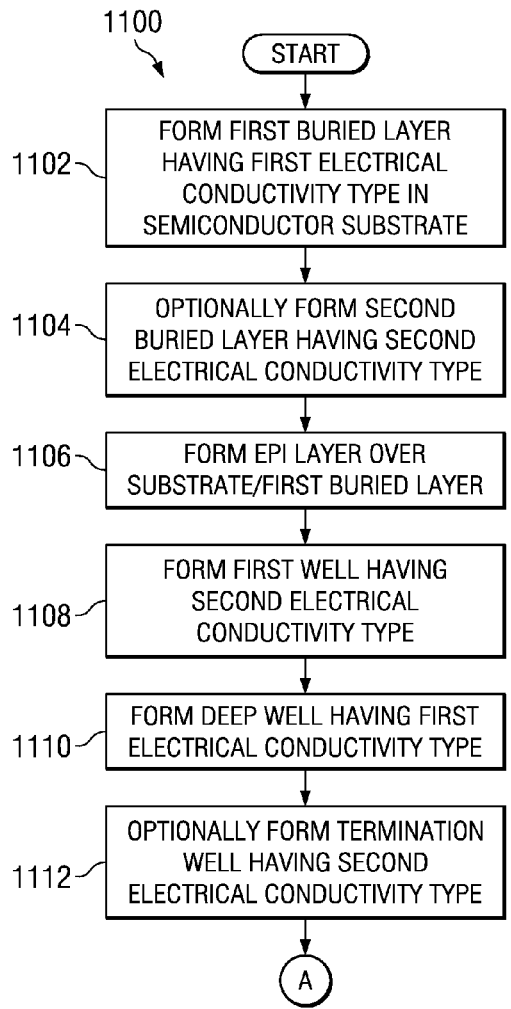
FIGS. 11*a* and 11*b* are flow diagrams illustrating an exemplary methodology for fashioning a QVGNP ESD protection device.
Figure 11B:
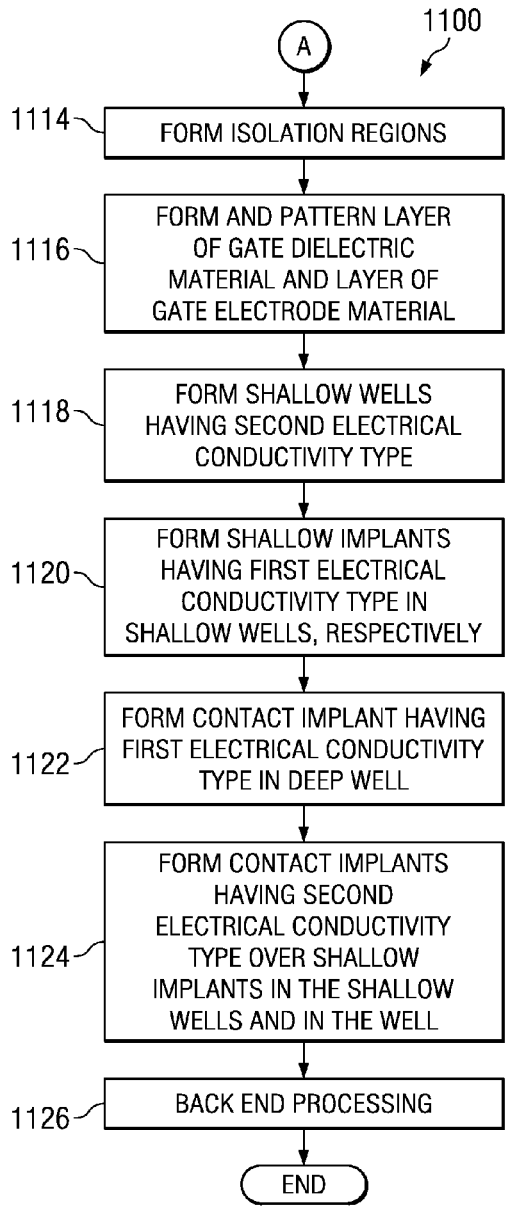
Figure 12:
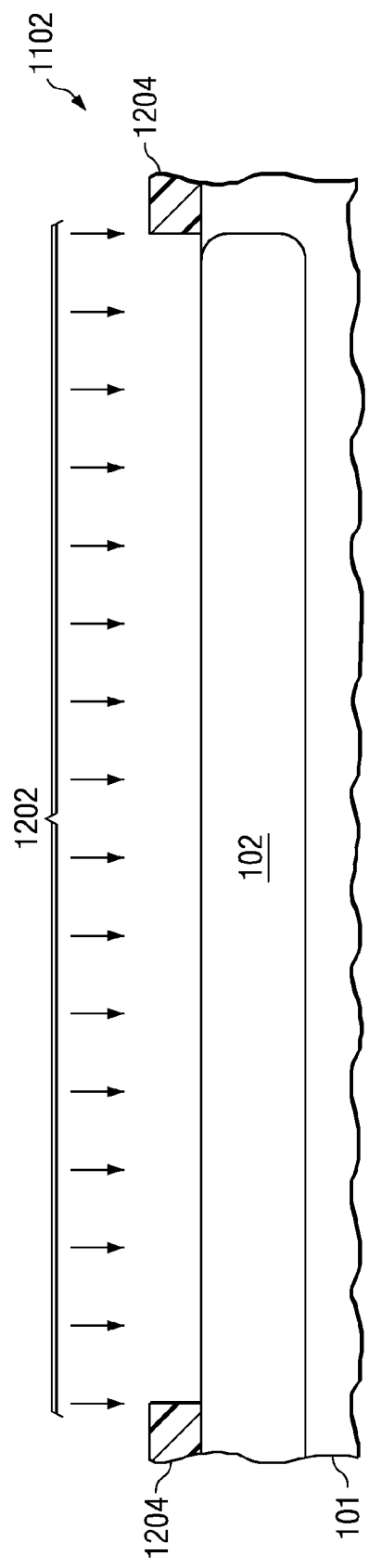
FIGS. 12-23 are cross-sectional views of a semiconductor body wherein an exemplary QVGNP protection device is processed.
Figure 13:
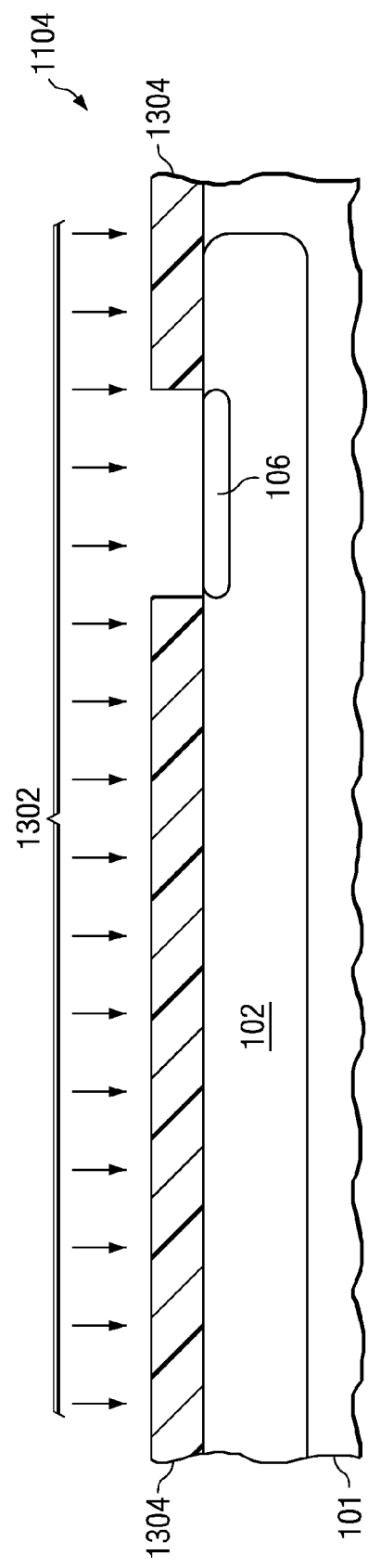
Figure 14:
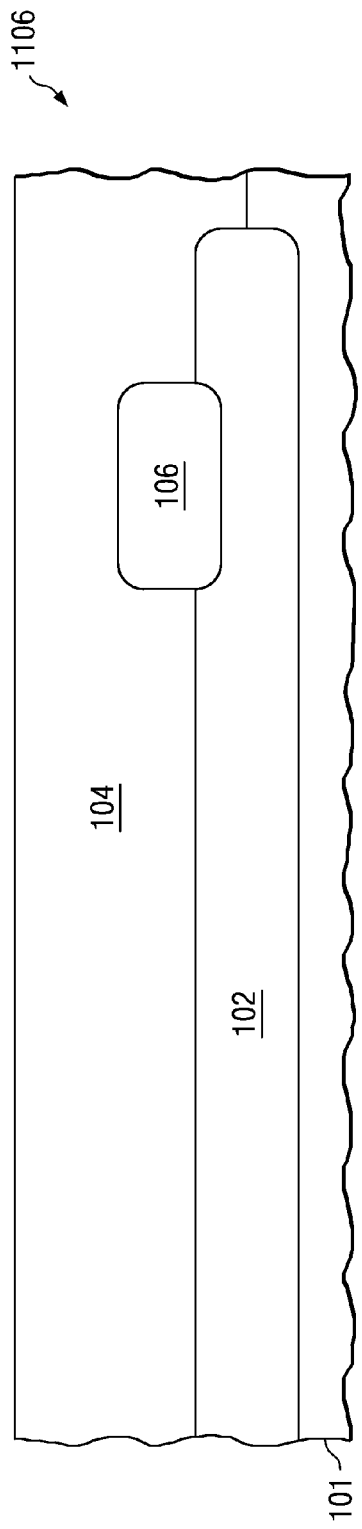
Figure 15:
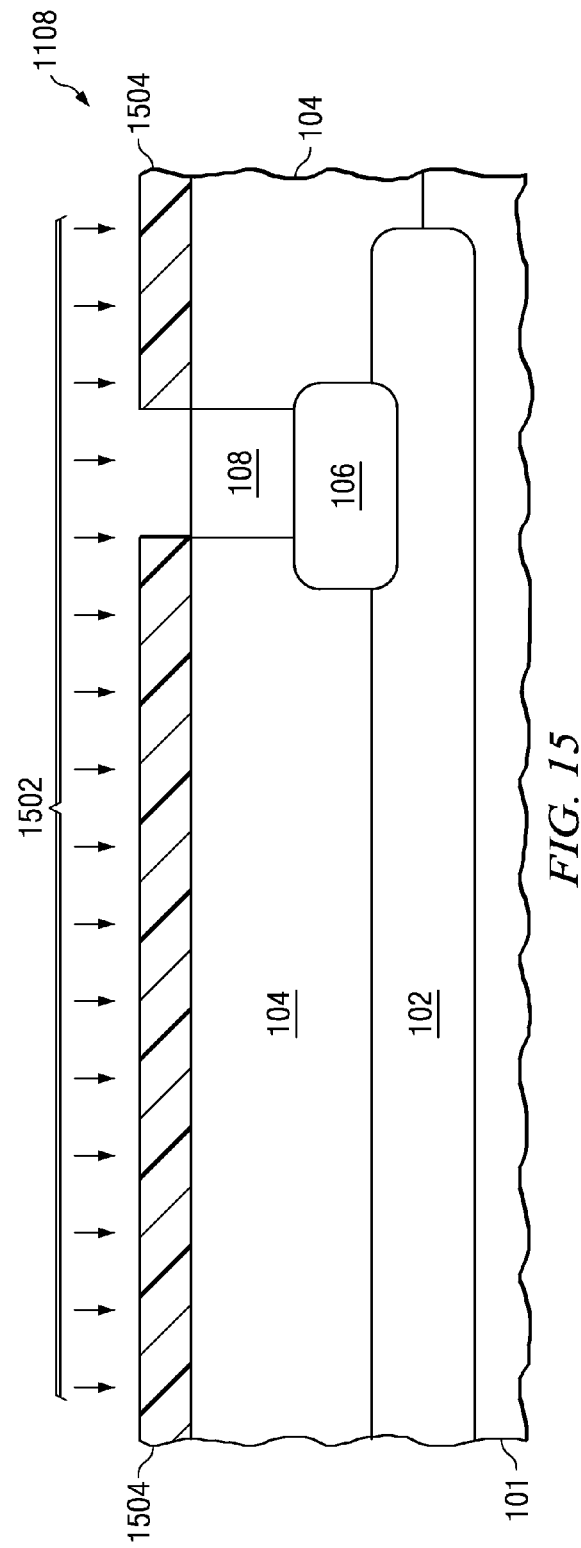
Figure 16:
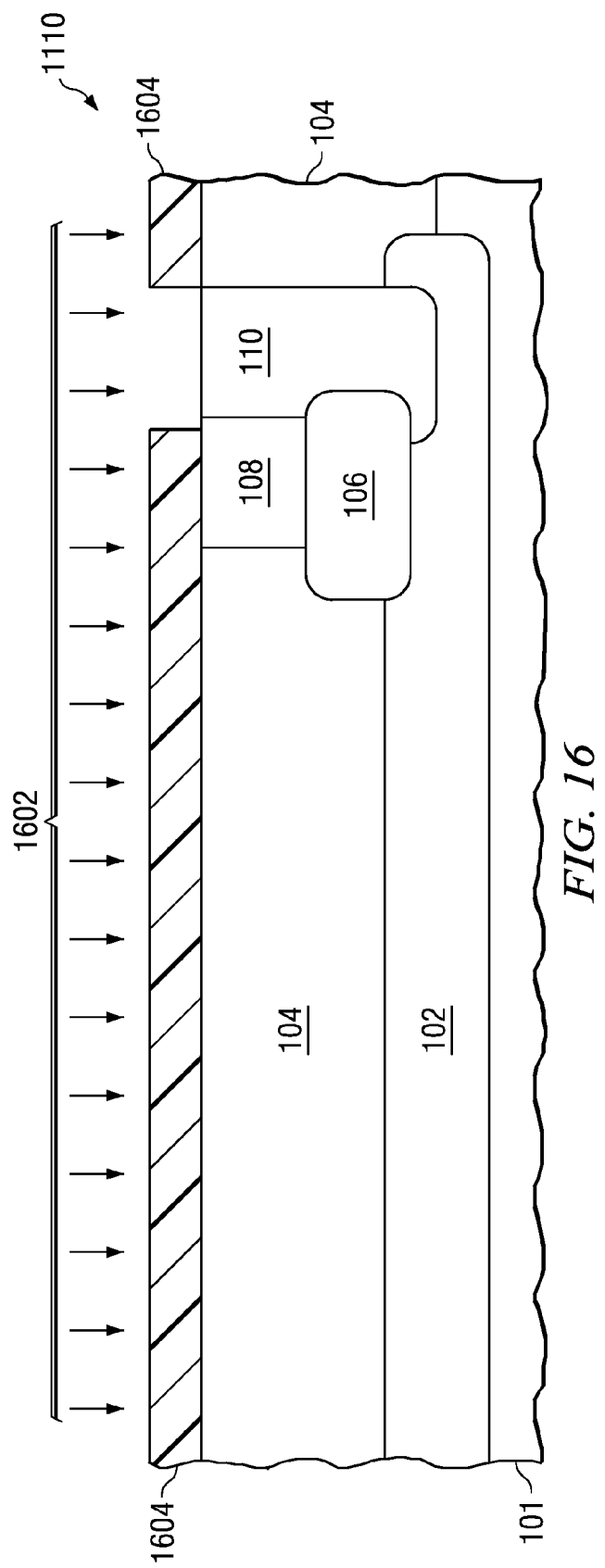
Figure 17:
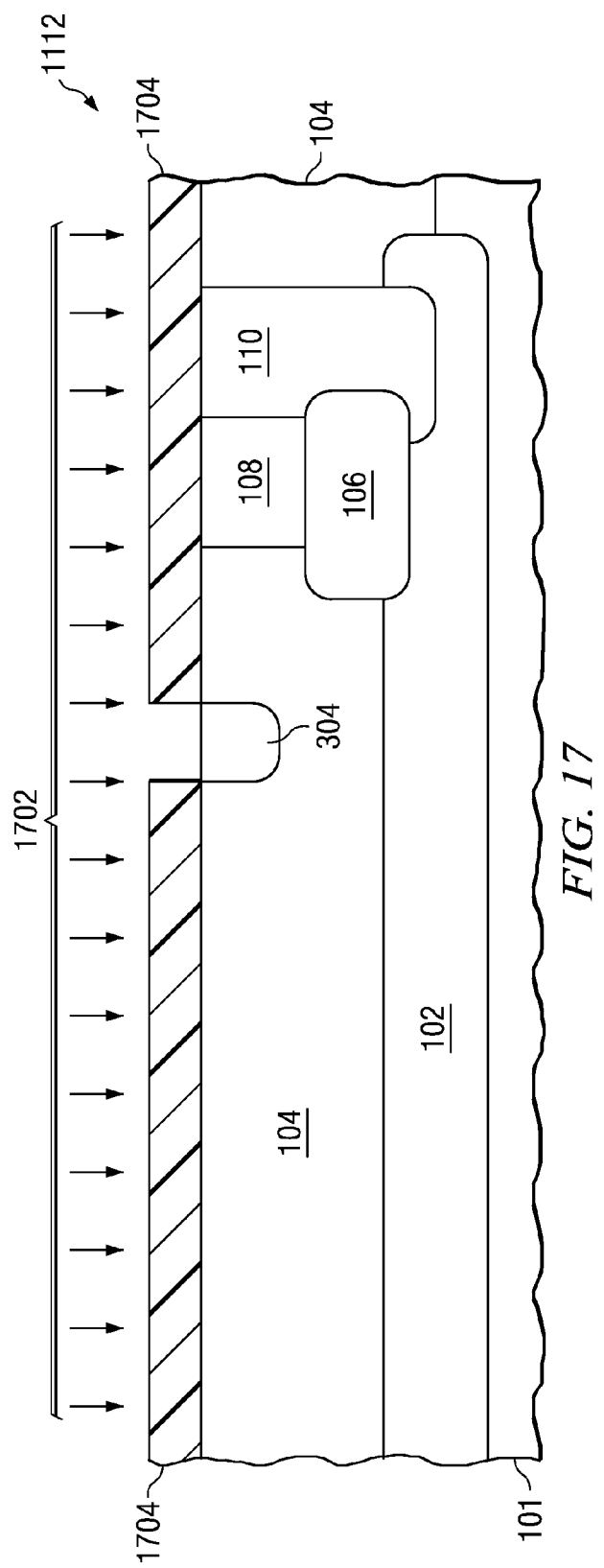
Figure 18:
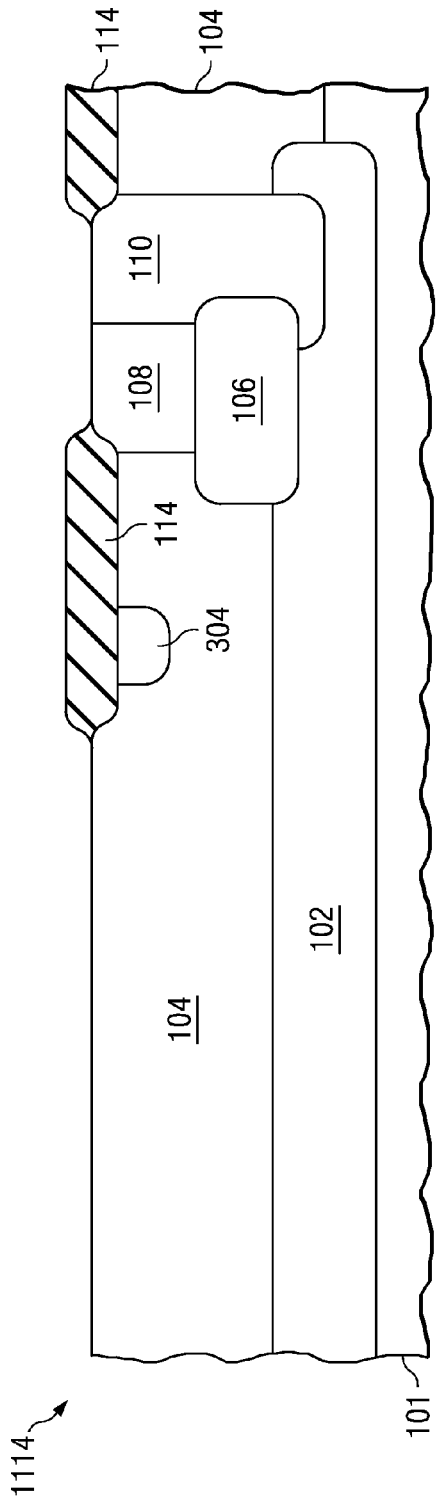
Figure 19:
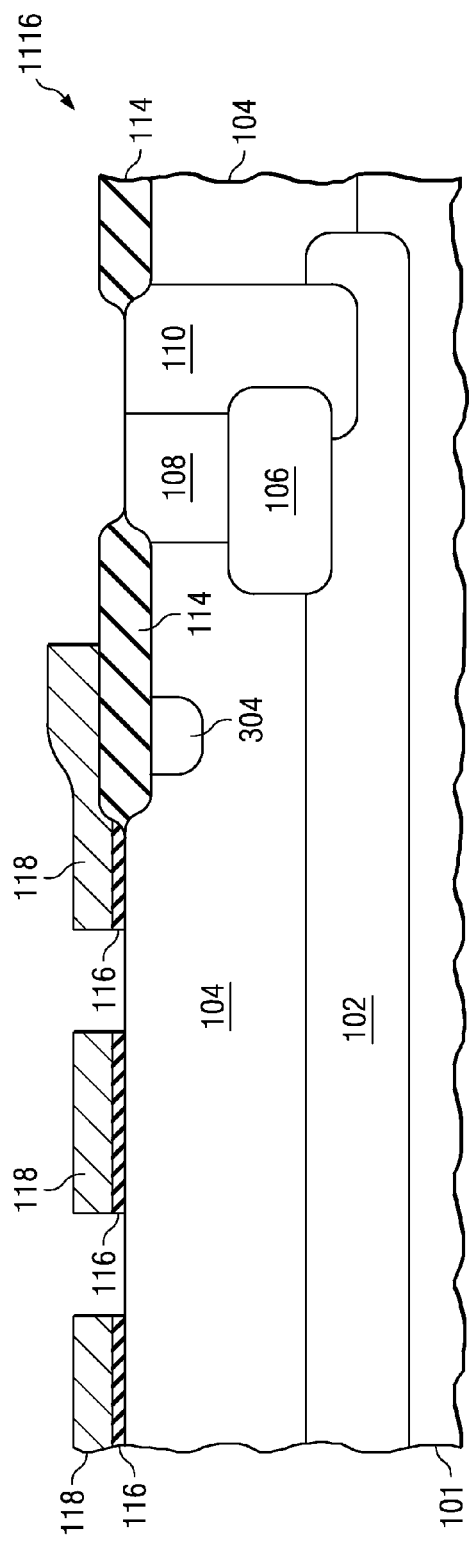
Figure 20:
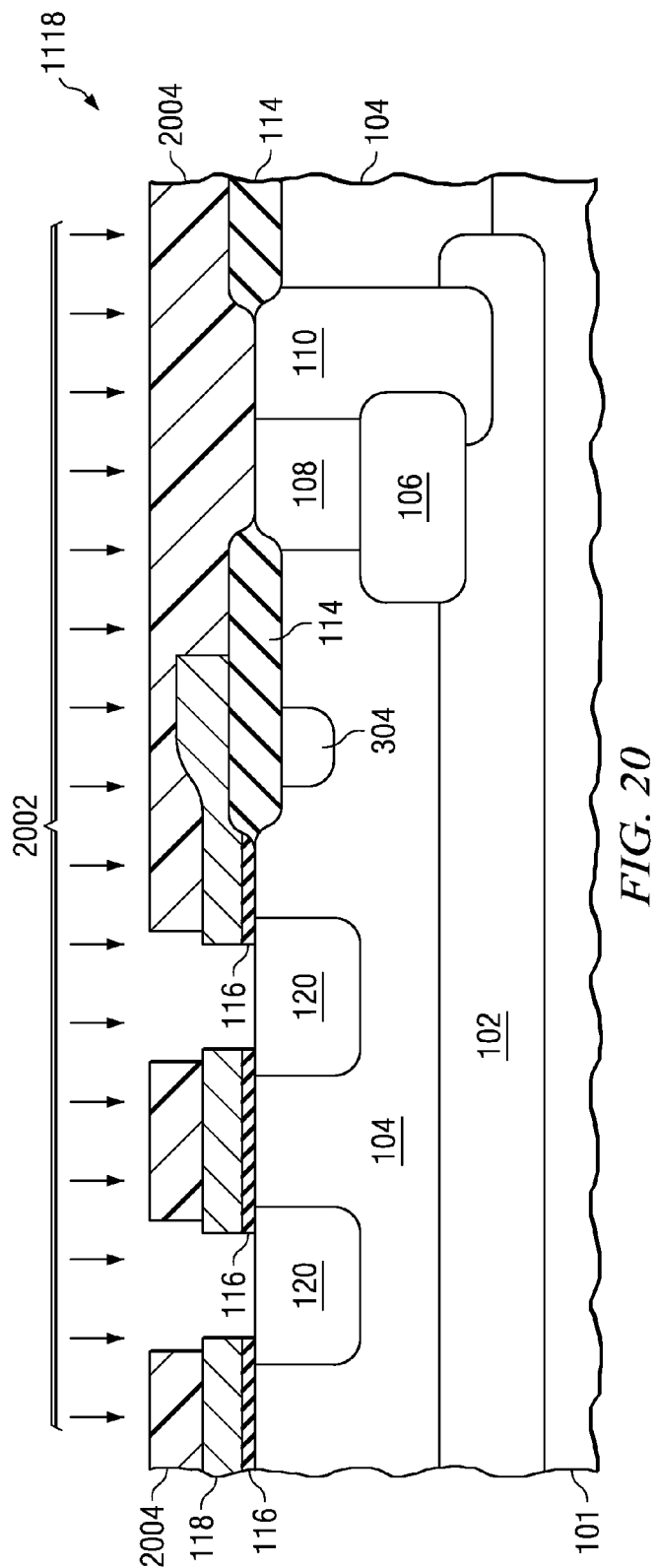
Figure 21:
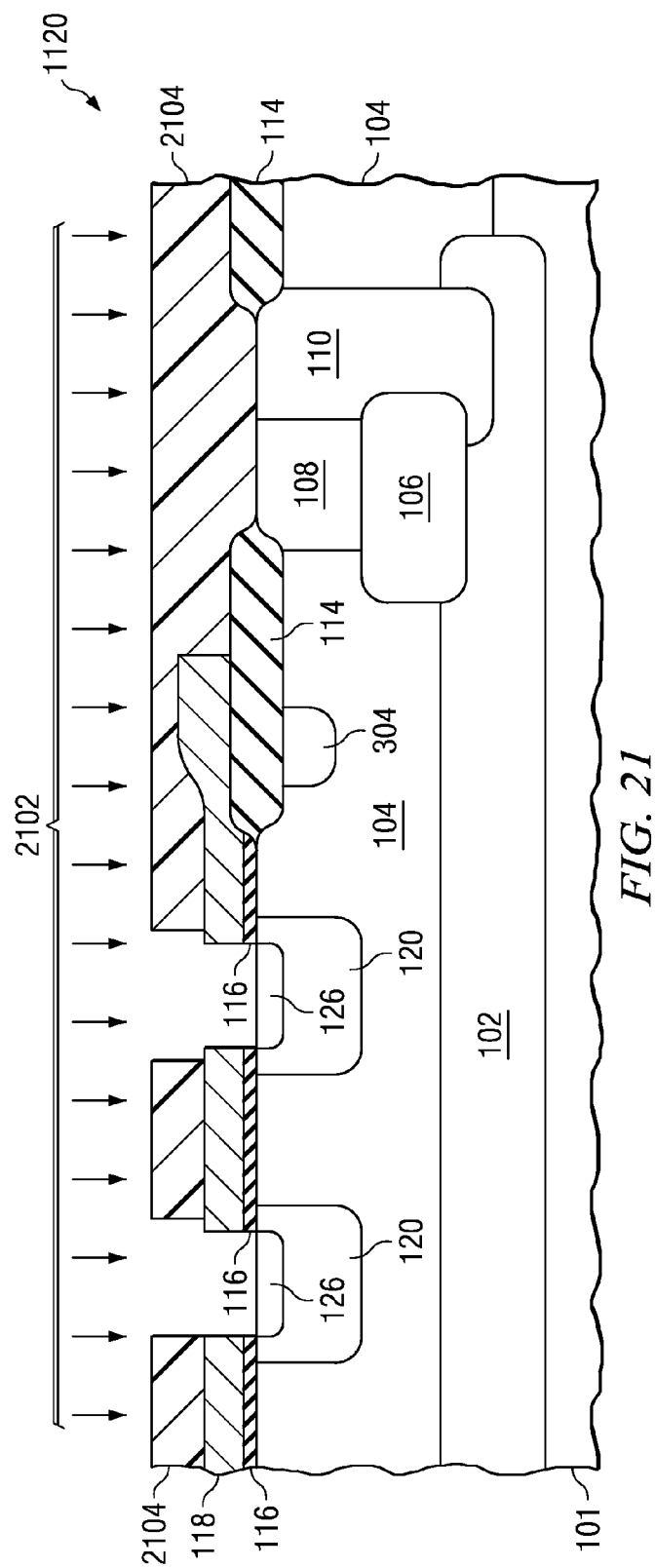
Figure 22:
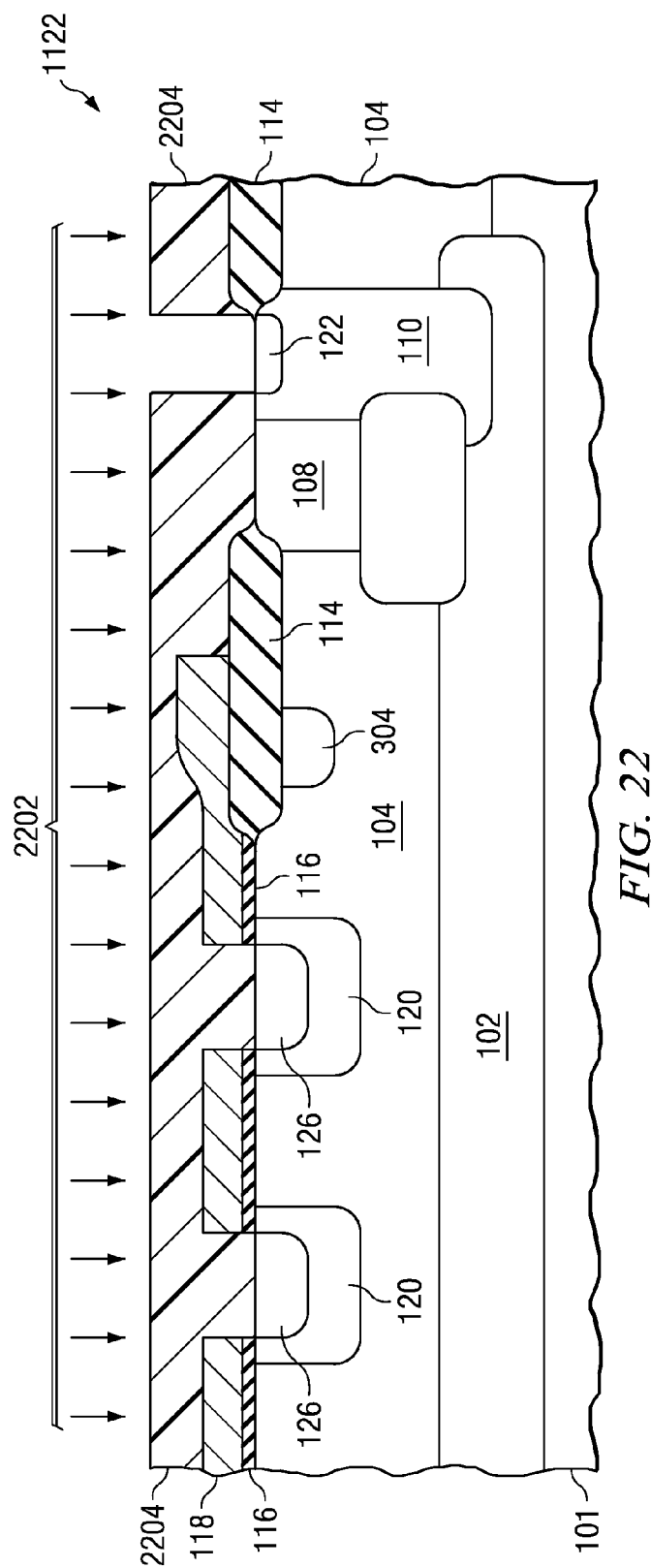
Figure 23:
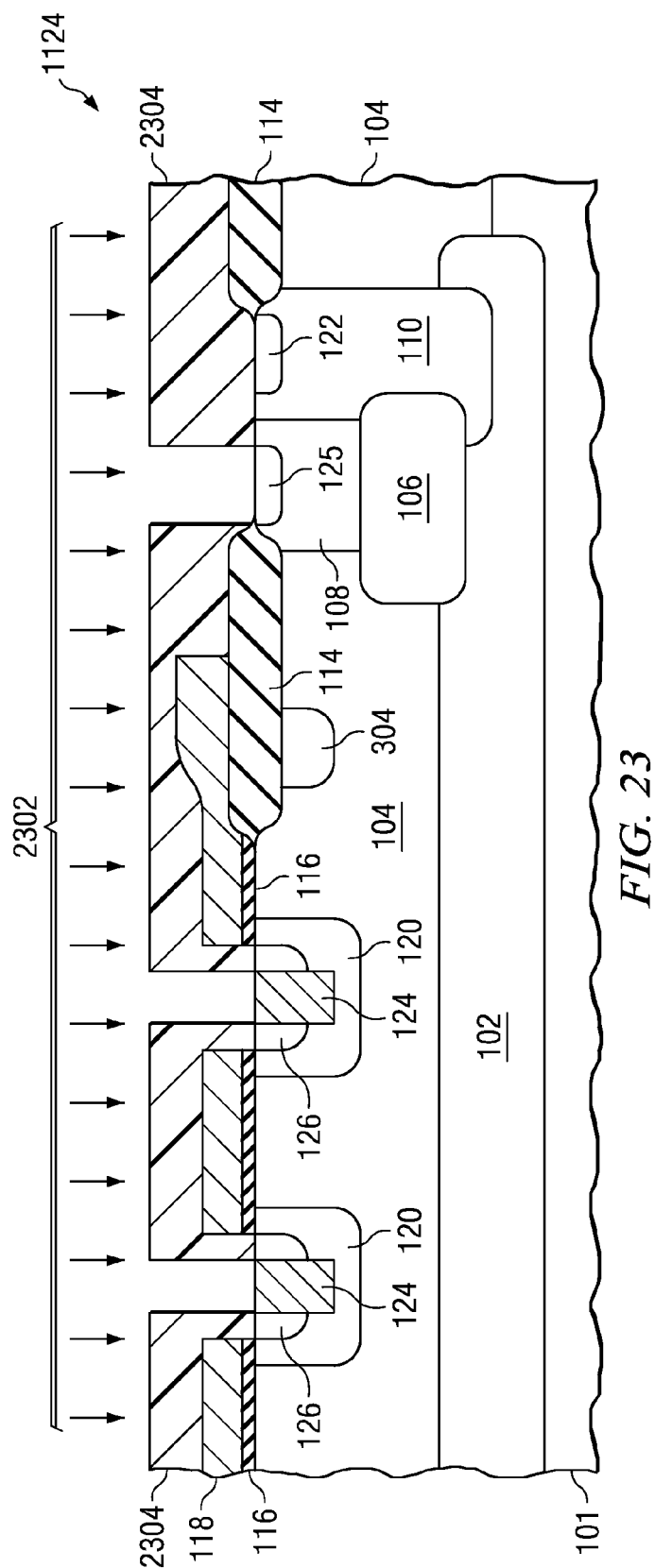

FIG. 11a and 11b are flow diagrams showing an exemplary methodology 1100 for forming a quasi-vertical gated NPN-PNP (QVGNP) electrostatic discharge (ESD) protection device is illustrated in FIG. 1, and FIGS. 12-23 are cross sectional views of a semiconductor body 101 wherein such a method is implemented. While the method 1100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

At the outset (1102), a first buried layer region 102 having a first conductivity type (e.g., n or p type) is formed in the semiconductor body 101. The buried layer is usually heavily doped to minimize the drain resistance of the QVDEMOS component part of the quasi-vertical gated NPN-PNP (QVGNP). In technologies using deep trench isolation as opposed to junction isolation, the buried layer implant can be made over the complete chip area (blanket implant, no mask is necessary).

It will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith.

An optional second buried layer 106 having a second conductivity type (e.g., p or n type) is formed in the first buried layer 102 at 1104. The second buried layer 106 can be formed, for example, by (selective) implantation 1302 of one or more dopants into the semiconductor body 101 having a second conductivity type. The second buried layer 106 has a concentration of second conductivity type dopants that is sufficient to overcome the concentration of first conductivity type dopants of the first buried layer 102 in this area of the substrate 101, for example due to a larger diffusion length of the dopants of this layer compared to the dopants used in the first buried layer 102.

At 1106, an epitaxial or EPI layer 104 having the first conductivity type is formed (e.g., grown) over the surface of the substrate 101. The depth of the EPI layer depends on the voltage rating of the device, it is typically between 2 um and 15 um in the 20-200V range. The EPI layer 104 may have the first conductivity type as formed and/or one or more dopants may be subsequently added thereto to instill the first conductivity type in the EPI layer 104. The dopant concentration of the EPI layer 104 is less than the dopant concentration of the first buried layer 102 (as well as the dopant concentration of other subsequently formed regions having the first conductivity type). Additionally, processing conditions associated with forming the EPI layer 104, such as elevated temperatures, for example, may promote some dopant diffusion. By way of example, the second buried layer 106 may diffuse up into the EPI layer 104.

The term epitaxial layer of as used in this disclosure is intended as a broadly reaching term and is not meant to solely comprise epitaxially grown layers. While the device of this disclosure may be built using an epitaxial layer, it does not require the use of an epitaxially grown layer. Non-epitaxially grown layers (like Silicon over Insulator layers) which are doped to have the first conductivity may comprise a layer equivalent to the epitaxial layer as referred to in this disclosure. The inventor has contemplated the use of a wide range of materials which may comprise the epitaxial layer of the disclosure.

A well 108 having the second conductivity type is formed in the EPI layer 104 down to the second buried layer 106 at 1108. The well, of which doping is comparable to the second buried layer, ideally extends into the second buried layer 106. This well 108 may be the well used to isolate EPI regions of first conductivity type, in combination with the second buried layer 106 for thick epitaxy layers. Note that if not used for isolation purpose in combination with layer 108, the first buried layer 102 can also be used as RESURF (reduced surface field) layer in vertical or lateral drain extended high voltage devices in BiCMOS technologies and Smart Power technologies.

An optional termination well 304 having the second conductivity type can then be formed in the EPI layer 104 at 1110. The termination well may form a (floating or non-floating) termination ring, for example, and is spaced apart from the first well 108. One will appreciate that the termination of a VDEMOS can be achieved in different ways and consider this topology as an example.

At 1112 a deep well 110 having the first conductivity type is then formed in the EPI layer 104 adjacent to the first well 108 and the second buried layer 106 and down to the first buried layer 102. The deep well 110 has preferably a peak dopant concentration close to that of the first buried layer 102. It should be low-ohmic to minimize the resistance of the VDEMOS up-drain terminal component and also to minimize the voltage drop across the device under ESD high current stress.

Isolation regions 114 are formed in the EPI layer 104 to electrically isolate different active areas from one another at 1114. The isolation regions 114 can for example comprise LOCOS (local oxidation of silicon) FOX (field oxide) regions or STI (shallow trench isolation) regions.

At 1116, a layer of gate dielectric material 116 is formed over the EPI layer 104 and isolation regions 114, and a layer of gate electrode material 118 is formed over the layer of gate dielectric material 116. The layer of gate dielectric material 116 generally comprises an oxide (or other dielectric) based material and/or a high-k material, for example, and is relatively thin, being formed to a thickness of between about 1 nm and about 50 nm, for example. The layer of gate electrode material 118 generally comprises a polysilicon (or other semiconductor) based material, and is formed to a thickness of between about 100 nm and about 400 nm, for example. The layer of gate electrode material 118 and the layer of dielectric material 116 are then patterned to expose merely some of the EPI layer 104 and isolation regions 114.

The shallow wells 120 having the second conductivity type are then formed in the EPI layer 104 spaced apart from the termination well 304 at 1118. The shallow wells 120 can have a peak doping concentration in the range 5e16 to 5e18 cm-3, for example. In smart power technologies, they can constitute the backgate well of a DMOS (double diffused MOS) transistor, or of a low-voltage MOS transistor in which they should be implanted prior to the gate oxide and gate electrode layers. In both cases, the well can be obtained by a chain of several implants (different energy/doses/tilts etc) for the purpose of threshold, breakdown or NPN gain engineering. Even though the figure shows only 2 wells of type 120, usual vertical DEMOS devices can include from 1 to 20 or more of such wells, the maximum number of wells results from the sheet resistance of the first buried layer 102.

At 1120, contact implants 126 having the first conductivity type are formed in the shallow wells 120. In a standard smart power process, the contact implants 126 can be the source layer of DMOS transistors or the source/drain implant of low-voltage MOS transistors or a combination of both. The shallow implants 126 can be formed using a dedicated mask, or, as usual in smart power technologies, by implantation through the same mask as for the wells 120 eventually self-aligned with the poly openings. In this case the channel length of the DEMOS device results from the differential diffusion of the dopants used in layers 120 and 126, whereby the diffusion length of the dopant of first conductivity is smaller than the one of the dopant of second conductivity. It can be appreciated that utilizing a single patterned resist/mask in association with multiple implantations streamlines the fabrication process, at least, by reducing the number of patterning activities that have to be performed.

A deep well surface implant 122 having the first conductivity type is formed in the deep well 110 in the EPI layer 104 at 1122. For example, it can be the same layer as used for the drain/source diffusions of low-voltage MOS transistors. It is a heavily doped (e.g. peak doping ~1E20 cm-3) of which the purpose is to provide a low-ohmic contact to the layer 110.

Similarly, at 1124, heavily doped contact implants 124 and 125 having the second conductivity type are respectively formed in the shallow wells 120 and in the first well 108. In case the contact implants 124 are performed into the shallow implants 126 (for example a DMOS source implant implanted with the same mask as for the wells 120), they have a concentration of second conductivity type (e.g., p or n type) dopants that is sufficient to overpower/overcome the concentration of first conductivity type (e.g., n or p type) dopants of the shallow implants 126 and that is sufficient to allow the contact implants 124 to be defined or identified in the shallow wells 120 (which have the same (second) conductivity type). In another implementation, where the regions 126 are not patterned simultaneously with the wells 120, the layers 126 can present a hole in the center of the wells 120, in order to allow contacting the latter wells without having to counter-dope the diffusions 126.

Back end processing terminates device fabrication is performed at 1126. By way of example, one or more conductive and/or dielectric layers can be formed and/or patterned during back end processing.

Fashioning a quasi-vertical gated NPN-PNP ESD protection device as described herein can be readily integrated into a standard BiCMOS or a smart power technology fabrication process.

While reference is made throughout this document to exemplary structures in discussing aspects of methodologies described herein (e.g., those structures presented in FIGS. 1 and 3-10, those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A self protecting quasi vertical drain extended MOS (QVDEMOS) device, comprising:
    one of a cathode or an anode region comprising:
        a first buried layer having a first conductivity type in a semiconductor body having a second conductivity type;
        an epitaxial (EPI) layer having either the first conductivity type above the first buried layer or the second conductivity type above the first buried layer, wherein the EPI layer having the second conductivity type is counter-doped by implantation of a doping having the first conductivity type;
        a first well having the second conductivity type in the EPI layer the first well situated over the first buried layer;
        a deep well having the first conductivity type in the EPI layer contiguous to the first well and extending down to the first buried layer;
    the other side of the cathode or anode region comprising:
        a shallow well having the second conductivity type in the EPI layer, wherein the at least one shallow well is spaced apart laterally from the first well and the first well is located between the shallow well and the deep well; and
        a shallow implant having the first conductivity type in the shallow well;
        a layer of gate dielectric material selectively patterned over the EPI layer;
        a layer of gate electrode material selectively patterned over the layer gate dielectric material; and
    wherein the gate electrode material and the gate dielectric material form a gate of the device and upon a bias being applied to the gate electrode material an electric field is generated which forms an inversion or channel region between the at least one shallow well and the EPI layer,
    wherein the first well, epitaxial layer and shallow well at least partly define one of coupled pnp and npn bipolar components; the shallow implant, shallow well and epitaxial layer at least partly define the other of the coupled pnp and npn bipolar components; and upon an ESD event occurring at an input node connected to the deep well and the first well, the coupled npn-pnp bipolar components are triggered, thereby shunting a current at the deep well to the shallow implants.

2. The device of claim 1, further comprising:
    a termination well having the second conductivity type in the EPI layer spaced laterally between the first well and the at least one shallow well, wherein the termination well, the at least one shallow well and the shallow implant comprise an anode of the device.

3. The device of claim 2, comprising:
    an isolation region situated next to or over some of the first well, the first shallow well, the termination well, or the deep well, wherein the isolation region substantially isolates the gate electrode from a high voltage cathode region.

4. The device of claim 1, wherein:
    one or more anodes, distributed across the device area, wherein the one or more anodes comprises at least the one or more additional shallow wells and the one or more shallow implants; and
    one or more cathodes are distributed across the anode area.

5. The device of claim 1, wherein:

from a top view of the device, at least one cathode area completely encloses at least one anode area; or from a top view of the device, at least one anode area completely encloses at least one cathode area.

6. The device of claim 1, further comprising:

an additional drain deep well having the first conductivity type in the EPI layer, wherein the additional deep well is spaced apart laterally from the at least one shallow well.

* * * * *